United States Patent
Dubois et al.

(10) Patent No.: US 10,214,831 B2
(45) Date of Patent: Feb. 26, 2019

(54) ONE-PIECE ELECTROFORMED METAL COMPONENT

(71) Applicant: Nivarox-FAR S.A., Le Locle (CH)

(72) Inventors: Philippe Dubois, Marin (CH); Christian Charbon, Chezard-St-Martin (CH)

(73) Assignee: Nivarox-FAR S.A., Le Locle (CH)

( * ) Notice: Subject to any disclaimer, the term of this patent is extended or adjusted under 35 U.S.C. 154(b) by 456 days.

(21) Appl. No.: 14/880,329

(22) Filed: Oct. 12, 2015

(65) Prior Publication Data

US 2016/0108544 A1 Apr. 21, 2016

(30) Foreign Application Priority Data

Oct. 17, 2014 (EP) ..................... 14189332

(51) Int. Cl.
| | |
|---|---|
| *C25D 21/04* | (2006.01) |
| *B81C 1/00* | (2006.01) |
| *G04B 13/02* | (2006.01) |
| *C22C 19/03* | (2006.01) |
| *C22C 45/04* | (2006.01) |
| *C25D 1/00* | (2006.01) |
| *G04B 1/14* | (2006.01) |
| *G04B 15/00* | (2006.01) |
| *G04B 37/22* | (2006.01) |

(Continued)

(52) U.S. Cl.
CPC .......... *C25D 21/04* (2013.01); *B81C 1/00674* (2013.01); *C22C 19/03* (2013.01); *C22C 45/04* (2013.01); *C25D 1/003* (2013.01); *G04B 1/145* (2013.01); *G04B 13/02* (2013.01); *G04B 15/00* (2013.01); *G04B 15/14* (2013.01); *G04B 37/22* (2013.01); *G04D 3/0074* (2013.01); *B81B 2201/035* (2013.01); *B81C 2201/032* (2013.01)

(58) Field of Classification Search
None
See application file for complete search history.

(56) References Cited

U.S. PATENT DOCUMENTS 5,453,174 A * 9/1995 Van Anglen ............. C25D 5/06
204/212
2003/0094215 A1 5/2003 Tanaka et al.
(Continued)

FOREIGN PATENT DOCUMENTS

| | | |
|---|---|---|
| CH | 706 653 A2 | 12/2013 |
| EP | 2 065 107 A1 | 6/2009 |

OTHER PUBLICATIONS

European Search Report dated Jul. 9, 2015 in European Application 14189332, filed on Oct. 17, 2014 ( with English Translation).

*Primary Examiner* — George Wyszomierski

(74) *Attorney, Agent, or Firm* — Oblon, McClelland, Maier & Neustadt, L.L.P.

(57) ABSTRACT

The invention relates to a one-piece metal component including an electroformed metal body, the external surface of the body including, only over or to a predetermined depth, less trapped hydrogen than the rest of the electroformed metal body causing a hardening relative to the rest of the body in order to improve the wear resistance of the one-piece component while preserving a relative magnetic permeability of less than 10 and the ability to be driven or pressed fit.

8 Claims, 3 Drawing Sheets

(51) Int. Cl.
*G04D 3/00* (2006.01)
*G04B 15/14* (2006.01)

(56) References Cited

U.S. PATENT DOCUMENTS

| | | | |
|---|---|---|---|
| 2006/0144711 A1* | 7/2006 | Kobata | B23H 3/02 205/82 |
| 2013/0105454 A1 | 5/2013 | Charbon et al. | |
| 2014/0003203 A1 | 1/2014 | Charbon et al. | |

* cited by examiner

ONE-PIECE ELECTROFORMED METAL COMPONENT

This application claims priority from European Patent Application No. 14189332.1 filed on Oct. 17, 2014, the entire disclosure of which is hereby incorporated herein by reference.

FIELD OF THE INVENTION

The invention relates to a one-piece electroformed metal component and notably such a component having improved wear resistance.

BACKGROUND OF THE INVENTION

It is known to form one-piece metal components with the aid of the LIGA process, namely a process that combines forming a mould, for example by photolithography, and filling said mould with the aid of electroforming.

However, these electroformed components are generally too soft and have unsatisfactory wear resistance.

SUMMARY OF THE INVENTION

It is an object of the present invention to overcome all or part of the aforecited drawbacks by proposing a one-piece electroformed component whose wear resistance is improved while preserving a relative magnetic permeability of less than 10 and the ability to be driven or pressed fit and a manufacturing method including a surface hardening step, the depth of which can easily be controlled.

To this end, the invention relates to a one-piece component including an electroformed metal body comprising trapped hydrogen, characterized in that the external surface of the body includes, only to a predetermined depth, a depletion of trapped hydrogen causing a hardening relative to the rest of the body in order to improve the wear resistance of the one-piece component while preserving a relative magnetic permeability of less than 10 and the possibility of being driven or pressed fit.

Thus, surprisingly, this surface hardening of the electroformed metal body, advantageously according to the invention, makes it possible to improve the wear resistance of the one-piece component while preserving a relative magnetic permeability of less than 10 while retaining the ability to be driven or pressed fit.

In accordance with other advantageous variants of the invention:
- the predetermined depth represents between 0.1% and 10% of the total thickness of the one-piece component;
- the metal is electroformed in amorphous form and the external surface includes an at least partially crystalline phase of the electroformed metal or a larger grain size than the electroformed metal of the rest of the body;
- the electroformed metal includes nickel, gold, or platinum such as a nickel-phosphorus, nickel-tungsten or nickel-cobalt-phosphorus alloy.

Further, the invention relates to a timepiece, characterized in that it includes a component according to any of the preceding variants, said component forming part of the timepiece exterior or part of the timepiece movement.

Finally, the invention relates to a method of fabricating a one-piece component including the following steps:
a) forming a mould on an electrically conductive substrate;
b) filling the mould by electroforming to form at least one one-piece metal component;
c) releasing said at least one-piece metal component from said substrate and from said mould;
characterized in that the method further includes:
d) effecting desorption of the trapped hydrogen in said at least one one-piece metal component during electroforming so as to produce, only over a predetermined depth of the external surface of the body, another form of electroformed metal by causing a hardening relative to the rest of the body.

Surprisingly, controlling the hydrogen desorption in the obtained one-piece metal component makes it possible to harden the external surface of the obtained one-piece metal component over an easily controlled depth. It is therefore understood that it is easy to achieve and control a hardening front from the external surface towards the centre of the component.

This surprising possibility runs counter to the technical prejudice that a heat treatment is always homogeneous, namely that hardening is effective between the external surface and the core of the component, especially for parts of timepiece whose thickness rarely exceeds 200 µm.

In accordance with other advantageous variants of the invention:
- the predetermined depth represents between 0.1% and 10% of the total thickness of the one-piece component;
- the metal is electroformed in step b) in amorphous form and the external surface includes an at least partially crystalline phase of the electroformed metal or a larger grain size compared to the metal electroformed in step b);
- the metal electroformed in step b) includes nickel, gold or platinum, such as a nickel-phosphorus, nickel-tungsten or nickel-cobalt-phosphorus alloy;
- step d) is performed in a controlled atmosphere with low partial pressure of hydrogen, formed as 95% dinitrogen and 5% dihydrogen at atmospheric pressure;
- step d) is performed in a vacuum;
- step d) lasts between 15 and 240 minutes at a temperature comprised between 250° C. and 450° C.

BRIEF DESCRIPTION OF THE DRAWINGS

Other features and advantages will appear clearly from the following description, given by way of non-limiting illustration, with reference to the annexed drawings, in which.

DETAILED DESCRIPTION OF PREFERRED EMBODIMENTS

As explained above, electroformed components are very satisfactory as regards their dimensions, notably when they are obtained through a LIGA process, but they are generally too soft and, incidentally, have unsatisfactory wear resistance.

Following a recent development which is explained further below, it was discovered that, surprisingly, it was possible to harden the external surface of electroformed components over or to an easily controlled depth.

This surprising possibility runs counter to the technical prejudice that a heat treatment is always homogeneous, namely that hardening is effective between the external surface and the core of the component, especially for part of a timepiece whose thickness rarely exceeds 200 μm.

The one-piece component formed of an electroformed body includes, advantageously according to the invention, an external surface which, only over or to a predetermined depth, includes a depletion of trapped hydrogen in the electroformed metal body causing a hardening relative to the rest of the body.

Indeed, depending on the material used, it is possible to electroform a metal component that is insensitive to magnetic fields. However, the hardening superficially transforming the metal that was initially electroformed in a homogeneous manner has a different form, which may be sensitive to magnetic fields, but which may also make its plastic range too limited to permit driving or pressing fit.

Consequently, with the aid of the surprising surface hardening of the electroformed metal body, it is therefore advantageously possible according to the invention to improve the wear resistance of the one-piece component while preserving a relative magnetic permeability of less than 10 and the ability to be driven or pressed fit.

Figure 1:
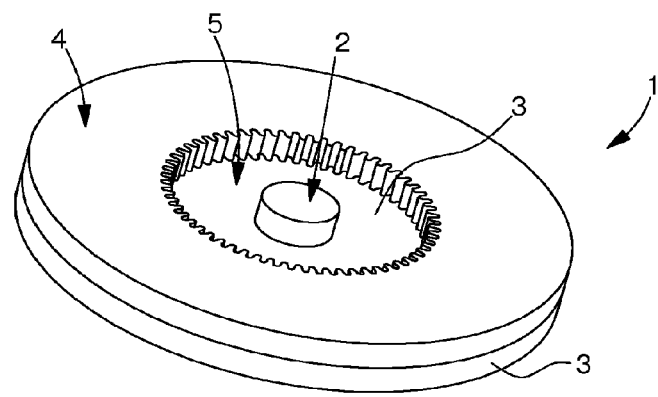
FIGS. 1 to 4 are diagrams of steps of the method according to the invention.

The fabrication method according to the invention includes a first step a) intended to form a mould 1 on an electrically conductive substrate 3 as shown in FIG. 1. Substrate 2 may be either intrinsically electrically conductive, such as steel or doped silicon, or be coated with an electrically conductive layer, such as glass, ceramic or gold and/or chromium coated silicon.

In the example illustrated in FIG. 1, mould 1 is formed by a resin obtained by photolithography forming a central portion 2 and a peripheral portion 4 whose interstice will be used to precisely form the negative pattern 5 of the future one-piece component. Of course, the advantage of such a mould is that it is not limited to a single pattern 5. Thus, several patterns 5 may advantageously be made on the same substrate, and said several patterns may or may not be identical.

The method continues with a second step b) intended to fill mould 1 by electroforming in order to form at least one one-piece metal component. The electroforming will be performed by connecting the electrically conductive surface of substrate 3 which forms the bottom of negative pattern 5. Preferably, the metal that is electroformed in step b) includes nickel, gold or platinum.

Even more preferably, it appears that a nickel-phosphorus, nickel-tungsten or nickel-cobalt-phosphorus alloy is particularly advantageous for forming a timepiece component, such as an external part of a timepiece or part of a timepiece movement. In the example illustrated in FIG. 1, negative pattern 5 is in the shape of a wheel.

Figure 2:
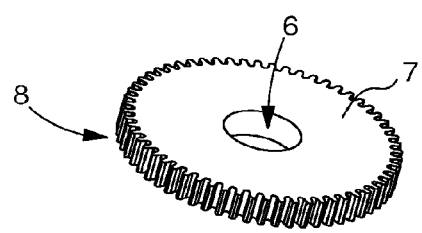
Figure 3:
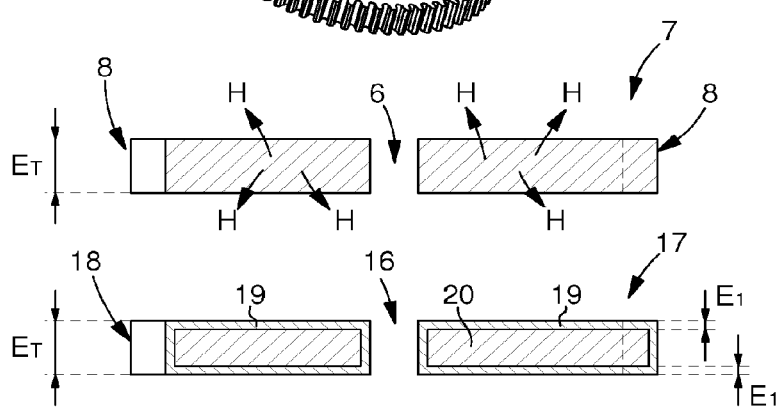

The method includes a third step c) intended to release said at least one one-piece metal component 7 from substrate 3 and from mould 1, as illustrated in FIG. 2. In this Figure, it is seen that one-piece metal component 7 thus includes a through hole 6 and a toothing 8 thereby forming a wheel. Step c) depends upon the type of substrate 3 used and the type of mould 1 used. Selective chemical etches are generally used in order to leave said at least one obtained one-piece metal component 7 intact.

Advantageously according to the invention, the method further includes the last step d) intended to effect desorption of the trapped hydrogen in said at least one one-piece metal component during the electroforming in step b). Indeed, following a recent development, it was discovered that hydrogen was trapped during the electroforming step.

Thus, surprisingly, controlling the hydrogen desorption in said at least one obtained one-piece metal component 7 makes it possible to harden the external surface of said at least one obtained one-piece metal component 7 over an easily controlled depth. It is therefore understood that it is easy to achieve and control a hardening front from the external surface towards the centre of the component.

Figure 4:
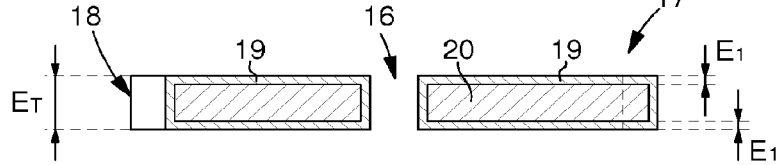

As shown in FIG. 4, it is thus clear that there is obtained a composite component 17 derived from component 7. Thus, the external surface 19 includes, only to a predetermined depth $E_1$, another form of the electroformed metal causing a hardening relative to the rest of the body 20 originally electroformed in step b). Component 17 advantageously maintains its original shape, namely toothing 18 and through hole 16.

Thus, tests demonstrated that a predetermined depth $E_1$ comprised between 0.1% and 10% of the total thickness $E_T$ of the one-piece component 17, namely $2 \cdot E_1 = 0.1\% - 10\% \cdot E_T$, surprisingly produces a component whose wear resistance is increased by 30% while preserving a relative magnetic permeability $\mu_R$ of less than 10 and the ability to be driven or pressed fit.

Depending on the material selected, the external surface may consist of an increase in grain size relative to the rest of the body or in a phase change relative to the rest of the body, such as, for example, the change from an amorphous phase to an at least partially crystalline phase.

According to the invention, step d) may be performed in a controlled atmosphere with low partial pressure of hydrogen or in a vacuum so that the trapped hydrogen escapes from component 7. By way of non-limiting example, one possible controlled atmosphere could consist of a fluid formed of 95% dinitrogen and 5% dihydrogen at atmospheric pressure. Finally, depending on the material used, step d) may last between 15 and 240 minutes at a temperature comprised between 250° C. and 450° C.

Figure 7:
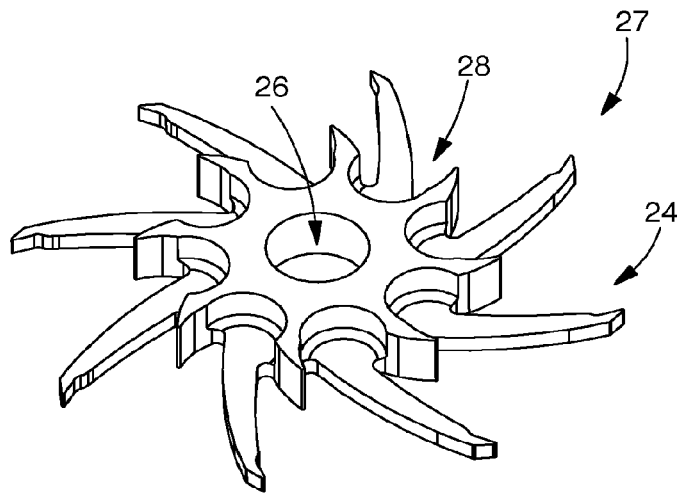
FIGS. 7 and 8 are diagrams of applications of the invention for a timepiece movement.

Advantageously according to the invention, it is easy to control the hardening front from the external surface towards the centre of the component. Indeed, FIG. 7 illustrates an example application of the present invention to a coaxial one-piece wheel 27 made of nickel-phosphorus and including a lower toothing 24, an upper toothing 28 and a through hole 26.

Figure 5:
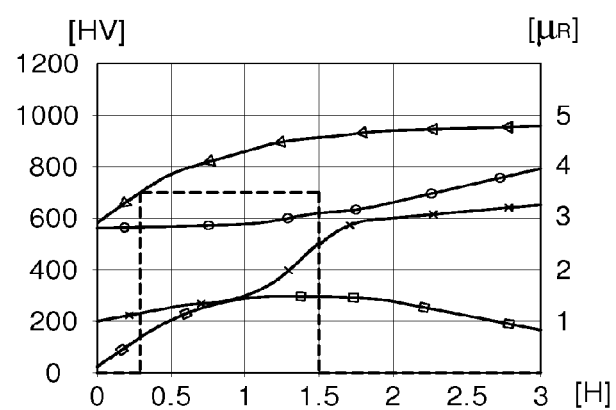
FIG. 5 is a graph intended to explain the consequences of variations in factors of the desorption step of the method according to the invention.

As seen in FIG. 5, the parameters of step d) have been modified to produce a graph showing the impact thereof on one-piece component 27. The abscissa shows the duration in hours (H) of step d), performed at 300° C. in a controlled atmosphere formed of 95% dinitrogen and 5% dihydrogen at atmospheric pressure. The ordinate shows, on the left, the Vickers hardness (HV) and on the right, the relative magnetic permeability ($\mu_R$).

The line marked with a triangle (Δ) represents the Vickers hardness with a load of 10 g (HV 0.01), the line marked with a circle (○) represents the Vickers hardness with a load of 500 g (HV 0.5) and the line marked with a square (□) represents the difference in hardness between the test with a load of 10 g and that with a load of 500 g. The line marked with a cross (X) represents the evolution of relative permeability $\mu_R$.

Observing the curve marked with a triangle (Δ), it is seen that the external hardness of component 27 increases rapidly during the first hour of desorption at 300° C. and then tends towards an asymptote close to 1,000 HV. In comparison, the curve marked with a circle (O), which represents the hardness at a depth of around 3 μm, is virtually stable until one hour of desorption at 300° C. It is thus clear, as seen in the curve marked with a square (□), that a very gradual transformation front is achieved. It is also seen with the curve marked with a square (□) that an extremum, representing a difference close to 300 HV, is reached at a value of 75 minutes of heating.

As explained above, it is an object of the present invention to increase wear resistance while preserving a relative magnetic permeability $\mu_R$ of less than 10 and while retaining the ability to drive or press fit the component. A surface delimited in a dash line is shown in FIG. 5 to represent the range within which these conditions are observed. It can be seen that the range of duration of step d) at 300° C. offering an advantageous compromise for a one-piece nickel-phosphorus component 27 extends from 15 to 90 minutes. Evidently, depending on the application and the material used, the range may however extend from 15 to 240 minutes.

In light of the tests, a 1 hour duration of step d) at 300° C. for a one-piece nickel-phosphorus component 27 seems the most optimal in that the hardness of the external surface is approximately 850 HV formed by a dendritic phase transformation front which gradually propagates towards the interior of the component as the hydrogen escapes, whereas the hardness at a depth of approximately 3 μm remains unchanged around 600 HV formed by an amorphous phase. Further, the relative permeability remains limited to 1.5, which makes the one-piece component insensitive to magnetic fields. Finally, after tests, it became clear that the one-piece component 27 could still be driven or press fit onto an arbor using the usual methods to form timepiece wheel sets.

Step d) according to the invention is different from an ordinary heat treatment of metals which is generally performed around 200° C. in order to relax internal stresses. By way of example, in the case of nickel-phosphorus, the phenomena described above only occur at temperatures substantially higher than 250° C.

Of course, the present invention is not limited to the illustrated example, but is capable of diverse variants and modifications which will appear to those skilled in the art. In particular, the same test must be performed according to the application, the temperature, the material used and the duration of step d) in order to determine the optimal parameters of the component to be fabricated.

Figure 8:
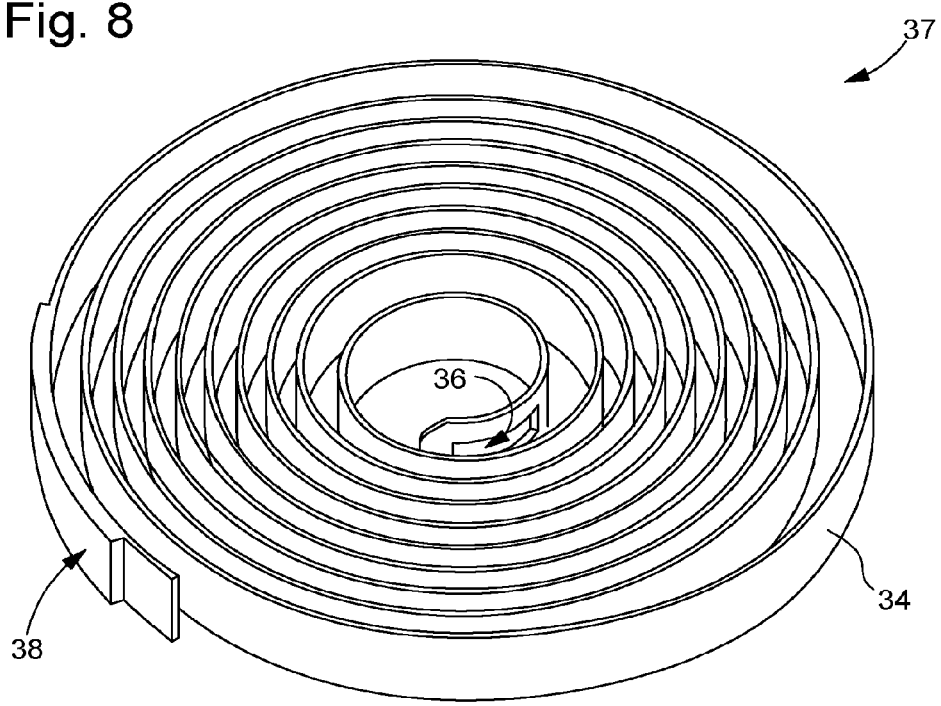

In an example illustrated in FIG. 8, a timepiece spring, such as a mainspring 37 does not need to be driven or pressed fit like a wheel set but simply joined by its eye 36 to the hook of the core of the barrel arbor (not shown). As such, it may certainly be subject to a longer step d), i.e. for example comprised between 90 and 240 minutes, in order to provide the timepiece with a longer power reserve. Further, since mainspring 37 is electroformed, strip 34 may have a variable cross-section intended to provide a substantially constant elastic torque during the letting down of mainspring 37 and/or include a bridle 38 in one-piece with strip 34.

Figure 6:
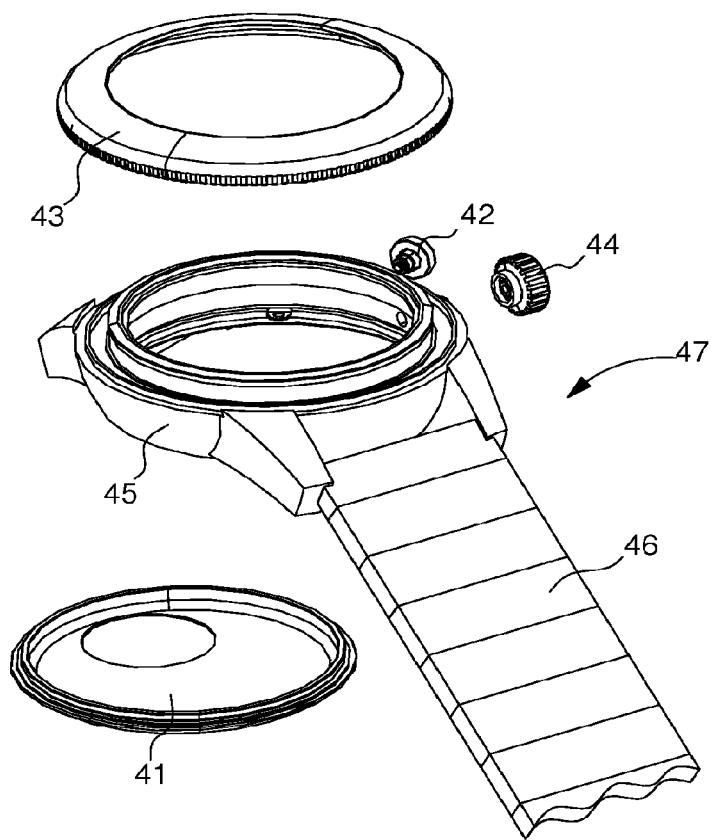
FIG. 6 is a diagram of applications of the invention for the external parts of a timepiece.

Likewise and as illustrated in FIG. 6, the application of the present invention is not limited to a part of a timepiece movement but may also advantageously be applied to the external parts of a timepiece. Indeed, although the back cover 41 and bezel 43 of a timepiece are generally driven or pressed fit, this is not the case of the case middle 45, bracelet 47, push-button 42 or crown 44.

Thus, in a non-limiting manner, case middle 45 or the links 46 of bracelet 47 may certainly be subject to a longer step d), i.e. for example comprised between 90 and 240 minutes, in order to provide improved wear resistance so that the timepiece is less marked during wear.

The method is also capable of being adapted without departing from the scope of the invention. Thus, it is possible to envisage depositing a sacrificial volume in hole 6 before step d), making it possible to limit the advance of the hardening front in the wall of hole 16, 26 and thereby make it even easier subsequently to drive or press fit the one-piece component 17, 27.

What is claimed is:

1. A method for fabricating a one-piece component, comprising:
a) forming a mould on an electrically conductive substrate;
b) filling the mould by electroforming to form at least one one-piece metal component comprising an electroformed metal body;
c) releasing the at least one one-piece metal component from the electrically conductive substrate and from the mould;
wherein the method further comprises:
d) effecting desorption of trapped hydrogen in the at least one one-piece metal component during electroforming so as to form, only over a predetermined depth of an external surface of the body, a hardening relative to the rest of the body,
wherein the metal is electroformed in the filling b) in amorphous form and the external surface comprises an at least partially crystalline phase of the electroformed metal.

2. The method according to claim 1, wherein the predetermined depth represents between 0.1% and 10% of the total thickness of the at least one one-piece component.

3. The method according to claim 1, wherein the external surface includes a larger grain size than the metal that is electroformed in the filling b).

4. The method according to claim 1, wherein the metal electroformed in the filling b) is a nickel-phosphorus, nickel-tungsten or nickel-cobalt-phosphorus alloy.

5. The method according to claim 1, wherein the effecting d) is performed in a controlled atmosphere with a partial pressure of hydrogen sufficiently low so that trapped hydrogen escapes from the component.

6. The method according to claim 5, wherein the controlled atmosphere is formed of 95% dinitrogen and 5% dihydrogen at atmospheric pressure.

7. The method according to claim 1, wherein the effecting d) is performed in a vacuum.

8. The method according to claim 1, wherein the effecting d) lasts between 15 and 240 minutes at a temperature comprised between 250° C. and 450° C.

* * * * *